(12) United States Patent
Cotton

(10) Patent No.: US 9,559,648 B2
(45) Date of Patent: Jan. 31, 2017

(54) AMPLIFIER WITH REDUCED IDLE POWER LOSS USING SINGLE-ENDED LOOPS

(71) Applicant: Texas Instruments Incorporated, Dallas, TX (US)

(72) Inventor: Lawrence Christopher Cotton, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 37 days.

(21) Appl. No.: 14/573,556

(22) Filed: Dec. 17, 2014

(65) Prior Publication Data

US 2015/0222237 A1 Aug. 6, 2015

Related U.S. Application Data

(60) Provisional application No. 61/936,570, filed on Feb. 6, 2014.

(51) Int. Cl.
| | |
|---|---|
| *H03F 99/00* | (2009.01) |
| *H03F 3/45* | (2006.01) |
| *H03F 3/217* | (2006.01) |
| *H03F 3/183* | (2006.01) |

(52) U.S. Cl.
CPC .......... *H03F 3/45479* (2013.01); *H03F 3/183* (2013.01); *H03F 3/2173* (2013.01); *H03F 3/45475* (2013.01); *H03F 2200/03* (2013.01); *H03F 2203/45078* (2013.01); *H03F 2203/45101* (2013.01); *H03F 2203/45138* (2013.01); *H03F 2203/45441* (2013.01)

(58) Field of Classification Search
CPC . H03F 3/45479; H03F 3/2173; H03F 2200/03
See application file for complete search history.

(56) References Cited

U.S. PATENT DOCUMENTS

| | | | | |
|---|---|---|---|---|
| 7,590,251 | B2* | 9/2009 | Andersen | H03F 1/523 381/106 |
| 8,188,790 | B1* | 5/2012 | Damitio | H03F 1/0222 330/127 |
| 9,301,046 | B1* | 3/2016 | Das | H04R 3/04 |
| 2003/0095000 | A1 | 5/2003 | Ramage et al. | |
| 2006/0008095 | A1* | 1/2006 | Tsuji | H03F 1/26 381/104 |

(Continued)

*Primary Examiner* — Regina N Holder
(74) *Attorney, Agent, or Firm* — Gregory J. Albin; Charles A. Brill; Frank D. Cimino

(57) ABSTRACT

A method of audio signal processing includes receiving a first audio input signal (first input signal) at an input of a first integrating amplifier of a first single-ended (SE) closed loop channel, and second input signal with a polarity reversed relative to the first input signal at an input of a second integrating amplifier configured of a second SE closed loop channel. During audio signal processing a common-mode (CM) reference voltage level applied to a current source coupled to an input of the first and second integrating amplifiers is dynamically changed including whenever a level of the input signals is below a predetermined low level, reducing the CM reference voltage level for implementing low duty cycle (LDC) PWM operation, and whenever the level is above a level that corresponds to an onset of clipping, increasing the CM reference voltage level for at least reducing the clipping to lower crossover distortion.

15 Claims, 4 Drawing Sheets

(56) References Cited

U.S. PATENT DOCUMENTS

| 2007/0210861 | A1 | 9/2007 | Chen | |
|---|---|---|---|---|
| 2014/0125413 | A1* | 5/2014 | Nys | H03F 3/3022 |
| | | | | 330/260 |
| 2014/0355790 | A1* | 12/2014 | Panov | H03F 3/217 |
| | | | | 381/120 |
| 2015/0311785 | A1* | 10/2015 | Kim | H03F 1/0255 |
| | | | | 327/536 |

* cited by examiner

AMPLIFIER WITH REDUCED IDLE POWER LOSS USING SINGLE-ENDED LOOPS

CROSS REFERENCE TO RELATED APPLICATIONS

This application claims the benefit of Provisional Application Ser. No. 61/936,570 entitled "REDUCED IDLE POWER LOSS PWM USING SINGLE-ENDED LOOP STRUCTURE", filed Feb. 6, 2014, which is herein incorporated by reference in its entirety.

FIELD

Disclosed embodiments relate to Class D power amplifiers.

BACKGROUND

A class-D power amplifier is an electronic amplifier in which the amplifying devices (typically MOSFETs to limit power loss) operate as electronic switches, instead of as linear gain devices as in other amplifiers. The signal received to be amplified is a train of constant amplitude pulses, so the active devices in the amplifier rapidly switch back and forth between a fully conductive (ON) and fully non-conductive (OFF) state.

The analog signal to be amplified is converted to a series of pulses (output pulse train) by pulse width modulation (PWM), pulse density modulation or other similar method before being applied to the amplifier. After amplification, the output pulse train can be converted back to an analog signal by passing the output pulse train through a passive low pass filter (LPF). The major advantage of a class-D amplifier is generally that it can be more efficient than analog amplifiers, with less power being dissipated as heat in the active devices.

Two single-ended channels can be used to create 1 bridge-tied load (BTL) output channel, where a BTL is an output configuration for audio amplifiers that implements a form of impedance bridging. The two channels of a stereo amplifier are fed the same monaural audio signal, with one channel's electrical polarity reversed relative to the other. A loudspeaker is connected between the two amplifier outputs, bridging the output terminals. BTL can double the voltage swing at the load as compared with the same amplifier used without bridging.

Ternary or 1 sinusoidal pulse width (SPW) modulation can reduce idle loss by creating a PWM waveform with a modified duty cycle at idle that is <a 50% duty cycle. The modified duty cycle idle condition reduces inductor ripple current. A low duty cycle (LDC) PWM generally referred to as LDC idle PWM is known to reduce power loss in class-D amplifiers. However, known methods for implementing LDC idle PWM require fully differential loop architectures in closed-loop class D audio amplifiers that need relatively large chip areas because known single-ended configurations result in the audio performance (such as crossover distortion) generally being unacceptable for most user' applications.

SUMMARY

This Summary briefly indicates the nature and substance of this Disclosure. It is submitted with the understanding that it will not be used to interpret or limit the scope or meaning of the claims.

Disclosed embodiments recognize true single-ended (SE) loop architectures for class-D power amplifiers are more area efficient for systems that support 4×(4 channel) SE, 2.1 and 2.0 bridge-tied load (BTL) configurations. In these highly configurable device configurations, BTL channels are created by combining SE loops. However, it is recognized that the SE loops cannot suppress the crossover distortion resulting from use of modulations including ternary modulation, and the resulting audio performance due to crossover distortion is generally not acceptable. A way of achieving a low idle loss PWM that is compatible with SE loops is needed which provides good audio performance including low crossover distortion, which is provided by disclosed power amplifiers.

Disclosed power amplifiers include at least two channels together with a common-mode (CM) control block for dynamically changing a CM reference voltage level applied to a current source that is coupled to one of the inputs of the integrating amplifiers of the respective channels. The reference voltage level controls the amount of current pulled from the input of the integrating amplifier it is coupled to, which functions to effect the output level of the power amplifier.

Whenever a level of the input signal is below a predetermined low level, the CM level applied to the current source coupled to an input (inverting or non-inverting) of the integrating amplifiers is reduced which implements low duty cycle (LDC) PWM operation, and whenever the level is above a level that corresponds to an onset of clipping, the CM level is increased to the current source prior to clipping for at least reducing (and generally avoiding) clipping to lower crossover distortion. A CM control block implements disclosed dynamic CM reference voltage level adjusting. Disclosed power amplifiers thus provide the benefits of LDC PWM without the complexity of a fully differential loop structure.

BRIEF DESCRIPTION OF THE DRAWINGS

Reference will now be made to the accompanying drawings, which are not necessarily drawn to scale, wherein.

DETAILED DESCRIPTION

Figure 1:
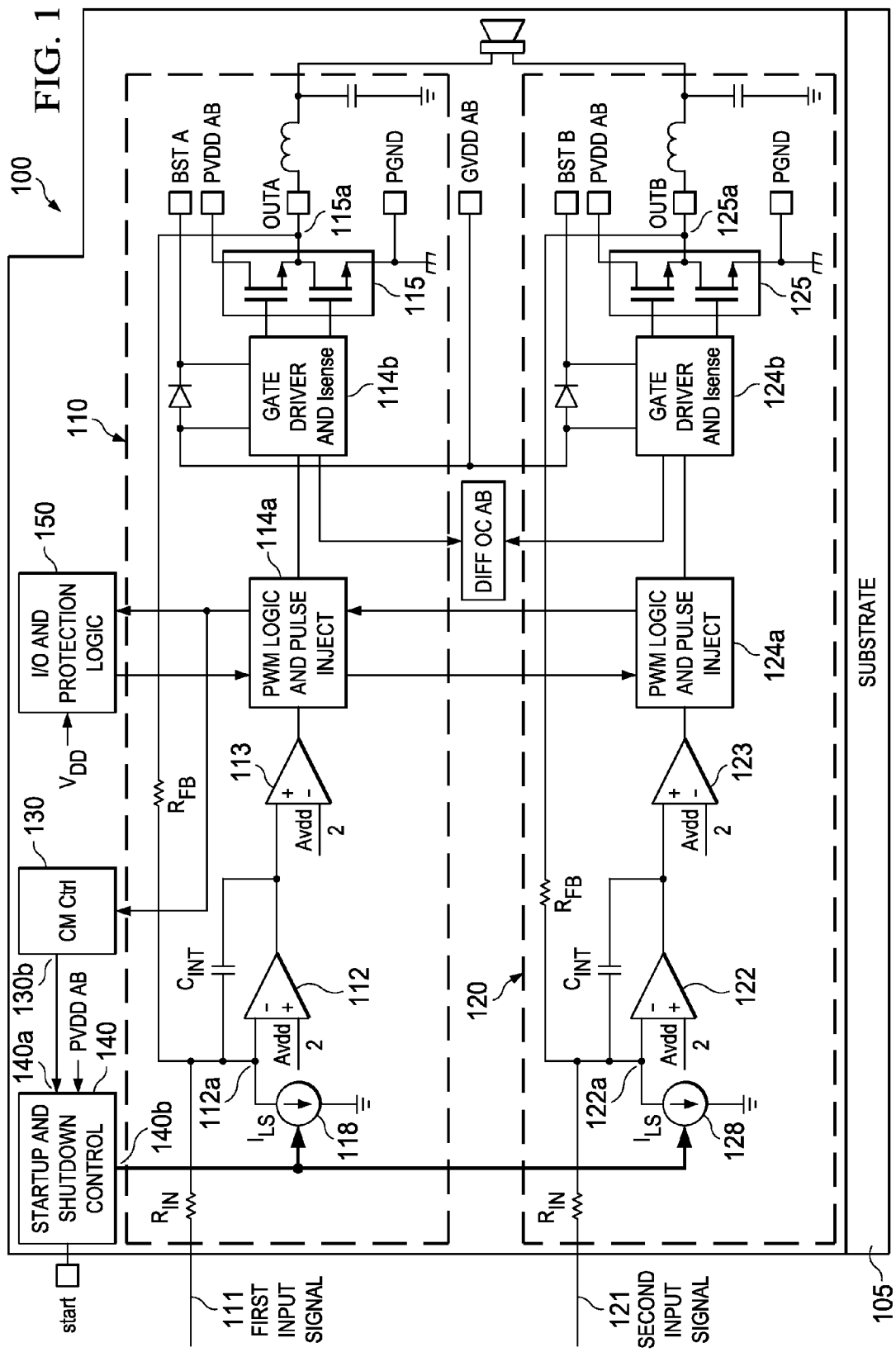
FIG. 1 shows example top level circuit architecture for a disclosed power amplifier that implements disclosed dynamic CM reference voltage level adjusting for providing reduced idle power loss PWM using SE loop structures, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

As noted above, known methods for implementing LDC idle PWM for reducing idle power loss require fully differential loop architectures in closed-loop class D audio amplifiers or the audio performance including crossover distortion is generally unacceptable. Disclosed power amplifiers having disclosed dynamic CM reference voltage level adjusting implement LDC PWM with SE closed loop architectures. SE loop architectures reduce the die area for highly configurable class D amplifier designs. Disclosed power amplifiers thus address the need for reduced idle power loss with SE closed-loop analog channels, where two SE channels are used to create a differential pair.

FIG. 1 shows example top level circuit architecture for a disclosed power amplifier 100 that has dynamic CM reference voltage level adjusting for implementing reduced idle power loss PWM using SE loop structures, according to an example embodiment. Power amplifier 100 is shown as a chip formed on a substrate 105 having a semiconductor surface, such as comprising silicon. Power amplifier 100 includes a first SE closed loop channel 110 for receiving a first audio input signal (first input signal) 111 shown at an inverting input 112a of at least a first amplifier 112. Although generally shown herein coupled to inverting inputs of the amplifiers, input signals for disclosed embodiments can alternatively be received at the non-inverting inputs of the amplifiers.

The first amplifier 112 is configured as an integrating amplifier having an integrating feedback capacitor shown as Cint which is coupled in sequence to a first comparator 113, a first pulse width modulation (PWM) logic and pulse inject block 114a, a gate driver and Isense block (gate driver block) 114b and a first output stage 115. Gate driver block 114b is shown receiving a boost voltage shown as BST A as an input. The first output stage 115 and other output stages are shown comprising series connected power NMOS devices. However, other output stages may be used, such as comprising PMOS devices, or other power devices such as insulated-gate bipolar transistors (IGBTs).

A first signal output 115a of the first output stage is fed back across a feedback resistor shown as Rfb to the inverting input 112a of the first amplifier 112. The PWM logic and pulse inject block 114a functions as the pre-clipping indicator for power amplifier 100.

A second SE closed loop channel 120 is for receiving a second audio input signal (second input signal) 121 with a polarity reversed relative to the first input signal at an inverting input 122a of at least a second amplifier 122. The second amplifier 122 is also configured as an integrating amplifier having an integrating feedback capacitor shown as Cint which is coupled in sequence with a second comparator 123, a second PWM logic and pulse inject block 124a and gate driver block 124b and a second output stage 125, wherein a second signal output 125a of the second output stage is fed back to the input 122a of the second amplifier 122. Gate driver block 124b is shown receiving a boost voltage shown as BST B as an input.

A CM control (CMC) block 130 (see FIG. 2 described below for an example CMC block 130 embodiment) has an input coupled to receive an output from the first PWM logic and pulse inject block 114a and from the second PWM logic and pulse inject block 124a. CMC block 130 dynamically controls the CM reference voltage level for changing an amount of level shifting current provided by the first current sources 118 and second current source 128 which are coupled to, and thus pull current from the inverting inputs 112a and 122a of the integrating amplifiers 112 and 122 to control the output level of the amplifiers.

$A_{VDD}$ is the positive power supply voltage for the analog channels, and the $A_{VDD}/2$ level is shown applied to the non-inverting inputs of amplifier 112 and 122 which can be generated by a simple resistor divider. The AVDD/2+0.5 V level is shown applied to the inverting inputs of the comparators 113 and 123. The level of $A_{VDD}/2$ shown can be varied with the voltage level to be convenient for the particular application. For power amplifier 100, the output voltage level of the integrating amplifiers 112 and 122 relative to the inverting inputs of comparators 113 and 123 determines the PWM pulse width, which is controlled by the feedback loop shown.

The difference between the level at the non-inverting and inverting input 112a and 122a of the integrating amplifiers 112 and 122 is what leads to the LDC PWM at the outputs OUTA and OUTB of the power amplifier 100. When the level at the non-inverting and inverting inputs 112a and 122a of the integrating amplifiers 112 and 122 are the same, a 50% DC is obtained. Although the CMC block 130 is shown controlling the reference voltage applied to the current sources 118 and 128 coupled to the inverting inputs 112a and 122a of the integrating amplifiers 112 and 122, the current sources 118 and 128 can alternatively be coupled to the non-inverting inputs of the integrating amplifiers 112 and 122. In one embodiment, the voltage difference between the CM reference voltage level after reducing the CM level and after increasing the CM reference voltage level to the nominal level is at least 1 V. However, exact reference voltage levels will generally be changed depending on the power supply used.

When the input signal level of the first and second input signals 111, 121 is low, the CM reference voltage level applied to the current sources 118 and 128 associated with the integrating amplifiers 112 and 122 is reduced to create an LDC PWM. The CM reference voltage level is increased when the input signal level of first input signal 111 and second input signal 121 increases above a higher level that corresponds to an onset of clipping. This CM reference voltage level increase thus occurs prior to clipping and avoids the crossover distortion introduced by known methods as evidenced in the simulation data shown in FIG. 3 described below.

A startup and shutdown control (SSC) block 140 has an input 140a coupled to an output 130b of the CMC block 130, wherein an output 140b of the SSC block 140 is coupled to modulate the amount of level shifting current generated by the current source 118 connected between the inverting input 112a of the first amplifier 112 and ground and the current source 128 connected between the inverting input 122a of the second amplifier 122 and ground. Other arrangements can be used for dynamically changing the reference voltage level to control the amount of current pulled from an input of the amplifiers 112 and 122 to effectuate changing the output level of the power amplifier.

An input/output (I/O) and protection logic block 150 is shown coupled to PWM logic and pulse inject blocks 114a and 124a. I/O and protection logic block 150 is shown receiving a power supply voltage shown as Vdd. SSC block 140 is shown receiving a positive power supply shown as PVDD AB which is also used as the positive power supply for the first output stage 115 and second output stage 125 which generate the power amplifier outputs OUTA and OUTB, respectively. The CM reference voltage level output by CMC block 130 scales with PVDD. PVDD_AB is not a supply for the CMC block 130, but is instead a reference level. GVDD AB shown is the positive power supply for the FET gate driver circuitry in the gate driver blocks 114b and 124b.

During audio signal processing the CMC block 130 is configured for dynamically changing a CM reference voltage level which is applied by the SSC block 140 to the current sources 118 and 128 that are shown coupled to inverting inputs 112a and 122a of the first amplifier 112 and the second amplifier 122. The dynamically changing of the CM reference voltage level includes whenever a level of the first input signal 111 or second input signal 121 (which are normally at the same level) is below a predetermined low level, reducing the CM reference voltage level applied to the current sources 118 and 128 associated with the first amplifier 112 and the second amplifier 122 for implementing LDC PWM operation, and whenever the signal level is above a level that corresponds to an onset of clipping where one side of the BTL pair would clip, increasing the CM reference voltage level to the current sources 118 and 128 associated with the first amplifier 112 and the second amplifier 122 for at least reducing clipping to lower crossover distortion. Texas Instruments Incorporated (TI) commercially supplies TAS56xx power stages which have a pre-clipping indicator block that detects the onset of clipping.

The CM reference voltage level is increased to accommodate full range operation as necessary. An attack and release circuit within the CMC block 130 can be used to return to LDC operation after the input signal level is reduced to below the predetermined low level. An attack and release circuit is for rapidly raising the CM reference voltage level in response to the pre-clip indicator detecting missing pulses so that signal clipping can be detected and corrected for before distortion is caused, and for returning the CM reference voltage level slowly to the low level after the input signal level is reduced to below the predetermined low level.

In the TI' TAS56xx family of power amplifier devices, a pre-clipping indicator is designed to be used for supply level adjust to implement Class-G power supply control. The PWM logic and pulse inject blocks 114a and 124a function as the clip detector/indicator which monitors the output of the comparators 113, 123 in the respective SE closed loop channels 110 and 120. As the comparator's PWM output reaches full modulation, the clip indicator is activated. The clip detector can look for missing pulses. However, one can set the minimum pulse width that can be detected as a clip indicator. As a result, signal clipping can be detected and corrected for before distortion is caused.

The clip detector itself is a known circuit and can be implemented using other approaches. For example, with traditional analog input class D amplifiers that use a triangular carrier wave to generate PWM, one can compare the output of the integrating amplifier to the ramp height to ensure clipping is not entered. In the TI' TAS56xx family of devices sold commercially, with TI being the assignee of this application, there is a pre-clipping detector designed to be used for Class-G power supply control. The clip indicator monitors the output of the PWM comparator in the channels. As the comparator PWM output reaches full modulation, the clip indicator is activated.

Figure 2:
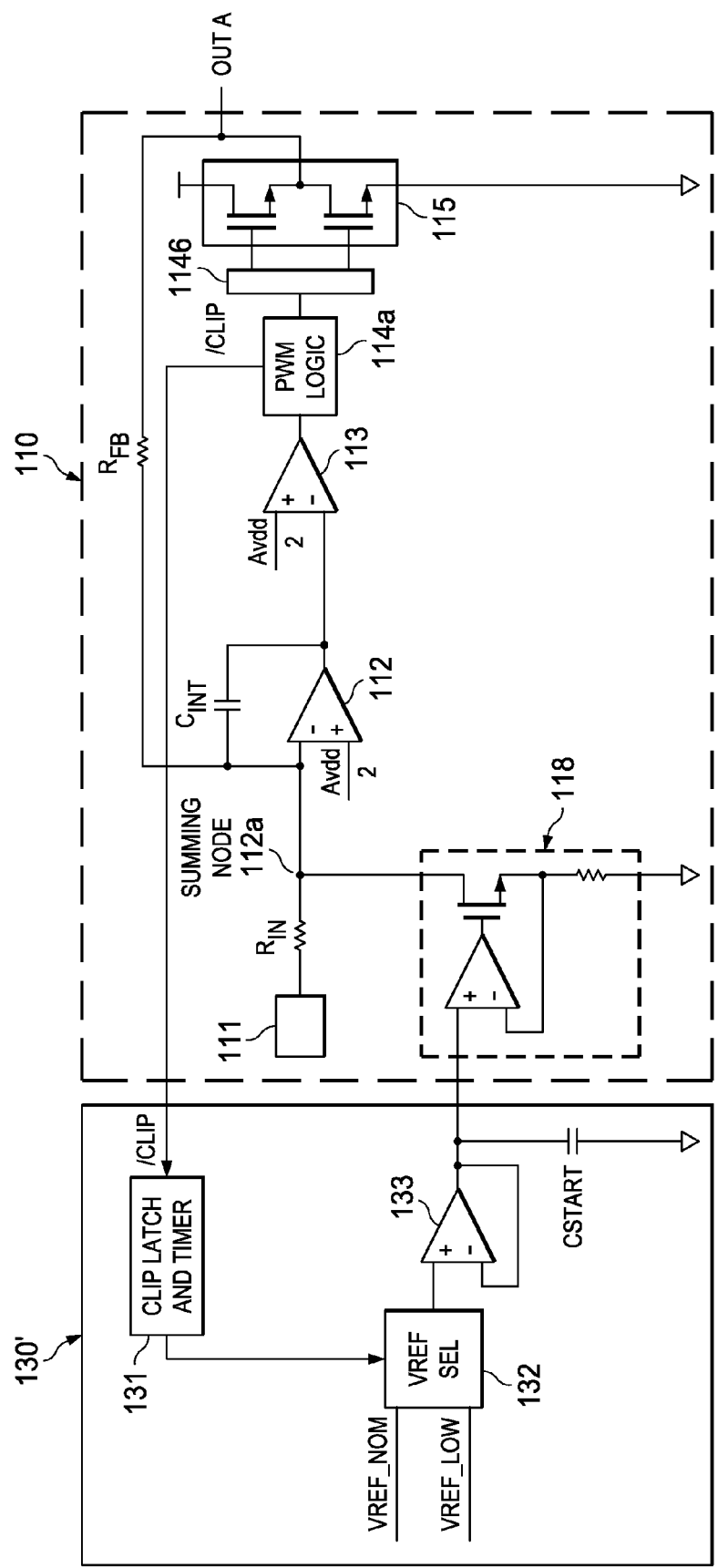
FIG. 2 shows an example CM control circuit coupled to the first SE closed loop channel shown in FIG. 1, according to an example embodiment.

FIG. 2 shows an example CM control circuit 130' configured as a control loop is coupled to the first SE closed loop channel 110 shown in FIG. 1, according to an example embodiment. CM control circuit 130' is shown including a clip latch and timer block 131 having an input coupled to receive a/CLIP output from the PWM logic and pulse inject block 114a shown as a "PWM logic block" that is coupled to a Vreference select block 132 which selects between a nominal CM VREF level (e.g., 2.7 V) and a low CM VREF level (e.g., 1 V). The output of the Vreference select block 132 is coupled to an op am 133 connected as a voltage follower that has an output which is coupled to drive an input of the current source 118.

Common-mode control circuit 130' together with current source 118 acts to control the amount of level-shifting current generated by current sources 118 and 128 pulled from the inverting input 112a acting as a summing node for the first amplifier 112. VREF_LOW is chosen to provide LDC PWM operation responsive to low input signal levels/CLIP activates VREF_NOM and thus dynamically increases the CM reference voltage level applied to the current source 118 responsive to higher input signal levels. The implementation of CM control circuit 130' shown in FIG. 2 is based a PWM input design, however disclosed CM control circuits can also be applied to analog input class D designs.

EXAMPLES

Disclosed embodiments are further illustrated by the following specific Examples, which should not be construed as limiting the scope or content of this Disclosure in any way.

Good audio performance including low total harmonic distortion (THD) has been confirmed up to clipping with a low CM reference voltage level used with the TI' TAS5632 power amplifier implementing an external version of disclosed CM reference voltage level control. Simulations performed showed that the CM reference voltage level can be changed without introducing pop/click problems. Listening tests with the TAS5632 also confirmed this result.

Figure 3:
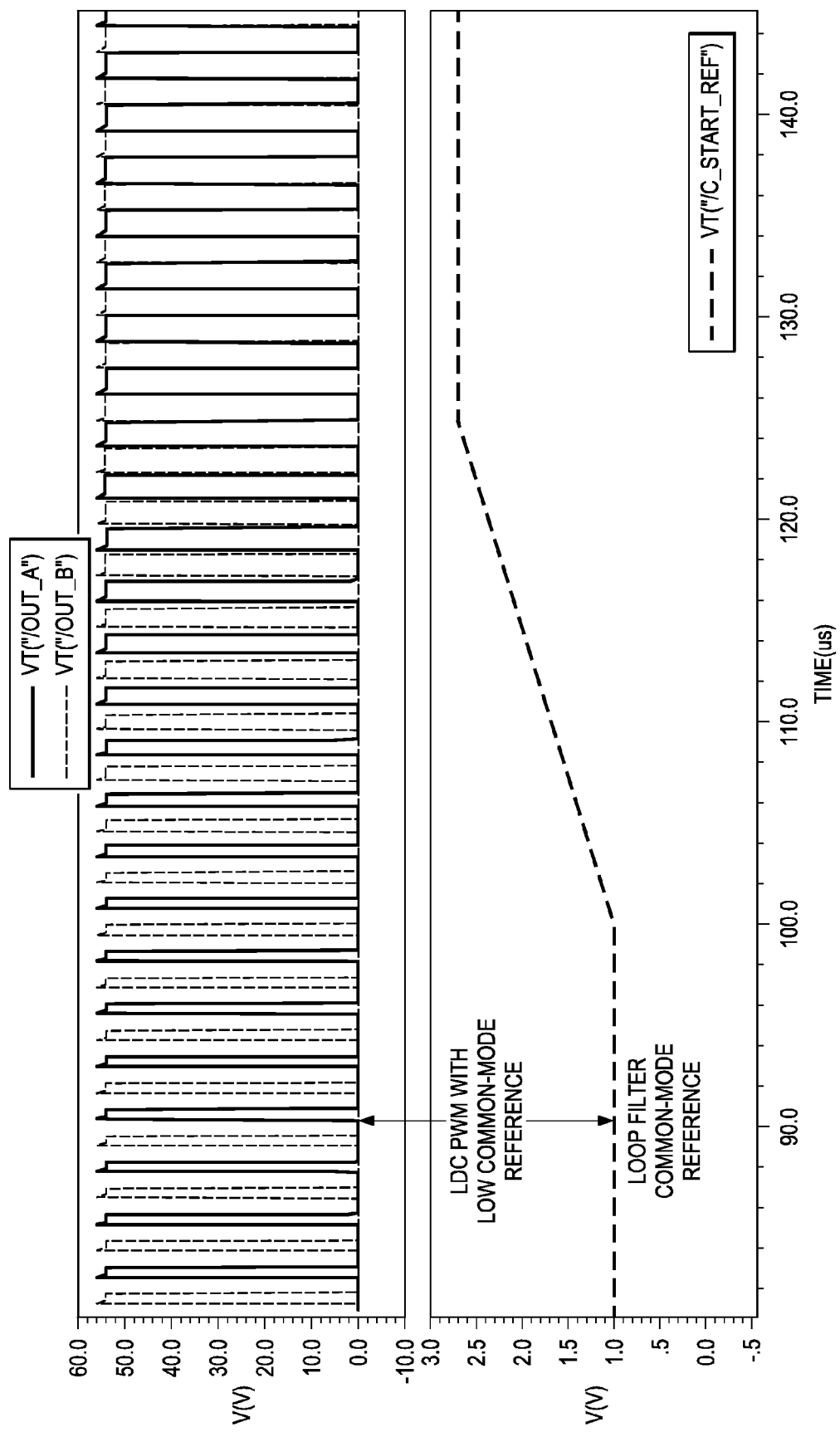
FIG. 3 shows the simulated transient response and duty cycle responsive to a CM reference voltage level change for a disclosed power amplifier showing the loop filter CM reference voltage level including a reduced level (shown as 1 V) and a nominal level (shown as 2.7 V) and resulting respective amplifier outputs OUTA and OUTB as a function of time, according to an example embodiment.

FIG. 3 shows the simulated transient response responsive to a CM reference voltage level change for power amplifier 100 showing the loop filter CM reference voltage level and resulting power amplifier outputs OUTA and OUTB as a function of time, according to an example embodiment. The external positive power supply VDD was 12V, and the power amplifier 100 had internal voltage regulators to create AVDD=7.75V and DVDD=3.3V from VDDA. The low CM reference voltage level used was 1 V resulting in LDC PWM operation provided for the first 100 μs with a Duty Cycle of about 15%, and with a nominal 2.7 V CM reference voltage level that provides a DC of about 50% which is at a level high enough to eliminate clipping to lower crossover distortion beginning at a time shown of about 126 μs. No clipping is shown in FIG. 3.

Figure 4A:
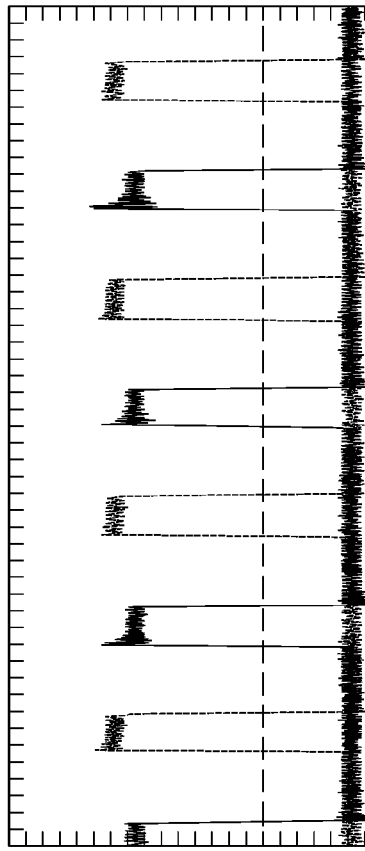
FIG. 4A shows measured transient response and duty cycle for a disclosed power amplifier with external CM reference voltage level control implementing a nominal CM level and FIG. 4B shows the measured transient response and duty cycle for the disclosed power amplifier implementing a reduced CM reference voltage level for implementing LDC PWM operation.
Figure 4B:
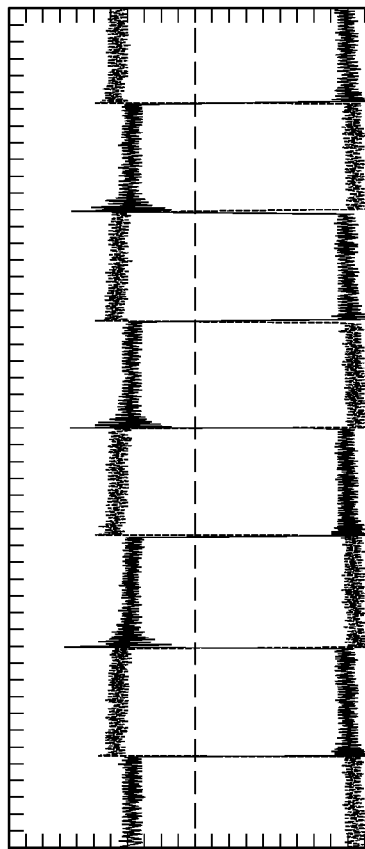

FIG. 4A shows measured transient response and duty cycle for a disclosed power amplifier with external CM reference voltage level control implementing a nominal CM reference voltage level of 2.7 V and FIG. 4B shows the measured transient response and duty cycle for the disclosed power amplifier implementing a reduced CM reference voltage level of 1 V for implementing LDC PWM operation. The idle power dissipation can be seen to be reduced from 3.23 W using a nominal CM reference voltage level of 2.7 V to 1.73 W during LDC PWM operation, with no significant change to THD or idle channel noise during LDC PWM operation.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of audio signal processing, comprising:
   a first single ended (SE) closed loop channel receiving a first audio input signal (first input signal) at an inverting or non-inverting input of a first amplifier, said first amplifier configured as an integrating amplifier that is coupled in sequence to a first comparator, a first pulse width modulation (PWM) logic and pulse inject block, gate driver block, and output stage, wherein a first signal output of said first output stage is fed back to said inverting input of said first amplifier, and
   a second SE closed loop channel receiving a second audio input signal (second input signal) with a polarity reversed relative to said first input signal at an inverting or non-inverting input of at least a second amplifier, said second amplifier configured as an integrating amplifier that is coupled in sequence with a second comparator, a second PWM logic and pulse inject block, gate driver block, and output stage, wherein a second signal output of said second output stage is fed back to said inverting input of said second amplifier;
   during said audio signal processing dynamically changing a common-mode (CM) reference voltage level applied to a first current source which is coupled to pull current from said inverting or non-inverting input of said first amplifier and a second current source which is coupled to pull current from said inverting or non-inverting input of said second amplifier including:
      wherein whenever a level of said first or second input signal is below a predetermined low level, reducing said CM reference voltage level for implementing low duty cycle (LDC) PWM operation, and
      wherein whenever said level is above a level that corresponds to an onset of clipping, increasing said CM reference voltage level for at least reducing said clipping to lower crossover distortion.

2. The method of claim 1, wherein said first signal output and said second signal output are combined for a differential pair to provide a bridge-tied load (BTL) output channel, further comprising driving a loudspeaker with said BTL output channel.

3. The method of claim 1, wherein said onset of clipping is sensed by a pre-clipping detector for detecting said onset of clipping when a pulse width at an output of said first amplifier or said second amplifier reaches a predetermined threshold pulse width or there are missing pulses detected.

4. The method of claim 3, wherein said dynamically changing said CM reference voltage level is implemented using a startup and shutdown control (SSC) block that has an input coupled to an output of a CM control (CMC) block which is coupled to an output of said pre-clipping detector, wherein an output of said SSC block is coupled for modulating a current generated by said first current source which is connected between said inverting input of said first amplifier and ground and said second current source which is connected between said inverting input of said second amplifier and said ground.

5. The method of claim 1, further comprising using an attack and release circuit for returning to said LDC PWM operation after said input signal level is reduced below said predetermined low level.

6. The method of claim 1, wherein said first and second comparators both comprise Schmitt triggers.

7. The method of claim 1, wherein a voltage difference between said CM reference voltage level after said reducing said CM reference voltage level and after increasing said CM reference voltage level is at least 1 V.

8. A power amplifier, comprising:
   a first single ended (SE) closed loop channel receiving a first audio input signal (first input signal) at an inverting or non-inverting input of a first amplifier, said first amplifier configured as an integrating amplifier coupled in sequence to a first comparator, a first pulse width modulation (PWM) logic and pulse inject block, gate driver block, and output stage, wherein a first signal output of said first output stage is fed back to said inverting input of said first amplifier;
   a second SE closed loop channel receiving a second audio input signal (second input signal) with a polarity reversed relative to said first input signal at an inverting or non-inverting input of at least a second amplifier, said second amplifier configured as an integrating amplifier that is coupled in sequence with a second comparator, a second PWM logic and pulse inject block, gate driver block, and output stage, wherein a second signal output of said second output stage is fed back to said inverting input of said second amplifier;
   a common-mode control (CMC) block having an input coupled to receive an output from said first PWM logic and pulse inject block;
   a startup and shutdown control (SSC) block having an input coupled to an output of said CMC block, wherein an output of said SSC block is coupled to dynamically modulate a common mode (CM) reference voltage level applied to a first current source which is coupled to pull current from said inverting or non-inverting input of said first amplifier and a second current source which is coupled to pull current from said inverting or non-inverting input of said second amplifier during audio signal processing, including:
      wherein whenever a level of said first or second input signal is below a predetermined low level, reducing said CM reference voltage level for implementing low duty cycle (LDC) PWM operation, and
      wherein whenever said level is above a level that corresponds to an onset of clipping, increasing said CM reference voltage level for at least reducing said clipping to lower crossover distortion.

9. The power amplifier of claim 8, further comprising a substrate having a semiconductor surface, wherein said power amplifier is formed on said semiconductor surface.

10. The power amplifier of claim 8, wherein said first current source is connected between said inverting input of said first amplifier and ground and said second current source is connected between said inverting input of said second amplifier and said ground for said SSC block.

11. The power amplifier of claim 8, further comprising a pre-clipping detector, wherein said onset of clipping is sensed by said pre-clipping detector for detecting said onset of clipping when a pulse width at an output of said first amplifier or an output of said second amplifier reaches a predetermined threshold pulse width or there are missing pulses detected.

12. The power amplifier of claim 8, further comprising an attack and release circuit for returning said power amplifier to said LDC PWM operation after said input signal level is reduced below said predetermined low level.

13. The power amplifier of claim 8, wherein said first and second comparators both comprise Schmitt triggers.

14. The power amplifier of claim 8, wherein said CMC block comprises a clip latch and timer block having an input coupled to receive a CLIP output from said first and second PWM logic and pulse inject block that is coupled to a Vreference select block for selecting between a nominal CM VREF level implemented by said increasing and a low CM VREF level implemented by said reducing, and wherein an output of the Vreference select block is coupled to an op amp which has an output coupled to drive an input of said first current source and an input of said second current source.

15. A power amplifier, comprising:
- a first single ended (SE) closed loop channel receiving a first audio input signal (first input signal) at an inverting or non-inverting input of a first amplifier, said first amplifier configured as an integrating amplifier coupled in sequence to a first comparator, a first pulse width modulation (PWM) logic and pulse inject block, gate driver block, and output stage, wherein a first signal output of said first output stage is fed back to said inverting input of said first amplifier;
- a second SE closed loop channel receiving a second audio input signal (second input signal) with a polarity reversed relative to said first input signal at an inverting or non-inverting input of at least a second amplifier, said second amplifier configured as an integrating amplifier that is coupled in sequence with a second comparator, a second PWM logic and pulse inject block, gate driver block, and output stage, wherein a second signal output of said second output stage is fed back to said inverting input of said second amplifier;
- a common-mode control (CMC) block having an input coupled to receive an output from said first PWM logic and pulse inject block;
- a startup and shutdown control (SSC) block having an input coupled to an output of said CMC block, wherein an output of said SSC block is coupled to dynamically modulate a common-mode (CM) reference voltage level applied to a first current source which is coupled to pull current from said inverting input of said first amplifier and a second current source which is coupled to pull current from said inverting input of said second amplifier during audio signal processing, including:
  - wherein whenever a level of said first or second input signal is below a predetermined low level, reducing said CM reference voltage level for implementing low duty cycle (LDC) PWM operation;
  - wherein whenever said level is above a level that corresponds to an onset of clipping, increasing said CM reference voltage level for at least reducing said clipping to lower crossover distortion, and
- a substrate having a semiconductor surface, wherein said power amplifier is formed on said semiconductor surface.

* * * * *